US006531703B1

(12) United States Patent
Tavkhelidze

(10) Patent No.: US 6,531,703 B1
(45) Date of Patent: *Mar. 11, 2003

(54) METHOD FOR INCREASING EMISSION THROUGH A POTENTIAL BARRIER

(75) Inventor: Avto Tavkhelidze, Tbilisi (GE)

(73) Assignee: Borealis Technical Limited (GI)

( * ) Notice: Subject to any disclaimer, the term of this patent is extended or adjusted under 35 U.S.C. 154(b) by 0 days.

This patent is subject to a terminal disclaimer.

(21) Appl. No.: 09/645,985

(22) Filed: Jun. 29, 1998

Related U.S. Application Data

(63) Continuation-in-part of application No. 09/020,654, filed on Feb. 9, 1998, now Pat. No. 6,281,514.

(51) Int. Cl.[7] .................................... H01L 29/15

(52) U.S. Cl. ........................ 250/493.1; 257/10; 257/17

(58) Field of Search ........................ 250/493.1; 257/10, 257/17

(56) References Cited

U.S. PATENT DOCUMENTS 6,281,514 B1 * 8/2001 Tavkhelidze ............. 250/493.1

* cited by examiner

*Primary Examiner*—Jack Berman

(57) ABSTRACT

A method for promoting the passage of elementary particles at or through a potential barrier comprising providing a potential barrier having a geometrical shape for causing de Broglie interference between said elementary particles is disclosed. In another embodiment, the invention provides an elementary particle-emitting surface having a series of indents. The depth of the indents is chosen so that the probability wave of the elementary particle reflected from the bottom of the indent interferes destructively with the probability wave of the elementary particle reflected from the surface. This results in the increase of tunneling through the potential barrier. When the elementary particle is an electron, then electrons tunnel through the potential barrier, thereby leading to a reduction in the effective work function of the surface. In further embodiments the invention provides vacuum diode devices, including a vacuum diode heat pump, a thermionic converter and a photoelectric converter, in which either or both of the electrodes in these devices utilize said elementary particle-emitting surface. In yet further embodiments, the invention provides devices in which the separation of the surfaces in such devices is controlled by piezo-electric positioning elements. A further embodiment provides a method for making an elementary particle-emitting surface having a series of indents.

8 Claims, 5 Drawing Sheets

METHOD FOR INCREASING EMISSION THROUGH A POTENTIAL BARRIER

CROSS REFERENCE TO RELATED APPLICATIONS

This is a Continuation-in-Part of the application titled "Method for Increasing of Tunneling through a Potential Barrier" Ser. No. 09/020,654, now U.S. Pat. No. 6,281,514, filed Feb. 9, 1998.

FIELD OF THE INVENTION

The present invention is concerned with methods for promoting the transfer of elementary particles across a potential energy barrier.

BACKGROUND

Vacuum Diodes and Thermionic Devices

In Edelson's disclosure, filed Mar. 7 1995, titled "Electrostatic Heat Pump Device and Method", Ser. No. 08/401, 038, incorporated herein by reference in its entirety, two porous electrodes were separated by a porous insulating material to form an electrostatic heat pump. In said device, evaporation and ionization of a working fluid in an electric field provided the heat pumping capacity. The use of electrons as the working fluid is disclosed in that application. In Edelson's subsequent disclosure, filed Jul. 5, 1995, titled "Method and Apparatus for Vacuum Diode Heat Pump", Ser. No. 08/498,199, an improved device and method for the use of electrons as the working fluid in a heat pumping device is disclosed. In this invention, a vacuum diode is constructed using a low work function cathode.

In Edelson's further subsequent disclosure, filed Dec. 15, 1995, titled "Method and Apparatus for Improved Vacuum Diode Heat Pump", Ser. No. 08/573,074, now U.S. Pat. No. 5,722,242, incorporated herein by reference in its entirety, the work function of the anode was specified as being lower than the work function of the cathode in order to optimize efficient operation.

In a yet further subsequent disclosure, filed Dec. 27, 1995, titled "Method and Apparatus for a Vacuum Diode Heat Pump With Thin Film Ablated Diamond Field Emission", Ser. No. 08/580,282, now abandoned, incorporated herein by reference in its entirety, Cox and Edelson disclose an improvement to the Vacuum Diode Heat Pump, wherein a particular material and means of construction was disclosed to further improve upon previous methods and devices.

The Vacuum Diode at the heart of Edelson's Vacuum Diode Heat Pump may also be used as a thermionic generator: the differences between the two devices being in the operation of the diode, the types and quantities of external energy applied to it, and the provisions made for drawing off, in the instance of the thermionic converter, an electrical current, and in the instance of the Vacuum Diode Heat Pump, energy in the form of heat.

In Cox's disclosure, filed Mar. 6, 1996, titled "Method and Apparatus for a Vacuum Thermionic Converter with Thin Film Carbonaceous Field Emission", Ser. No. 08/610, 599, now abandoned, incorporated herein by reference in its entirety, a Vacuum Diode is constructed in which the electrodes of the Vacuum Diode are coated with a thin film of diamond-like carbonaceous material. A Vacuum Thermionic Converter is optimized for the most efficient generation of electricity by utilizing a cathode and anode of very low work function. The relationship of the work functions of cathode and anode are shown to be optimized when the cathode work function is the minimum value required to maintain current density saturation at the desired temperature, while the anode's work function is as low as possible, and in any case lower than the cathode's work function. When this relationship is obtained, the efficiency of the original device is improved.

Many attempts have been made to find materials with low work function for use as cathodes for vacuum diodes and thermionic energy converters. Currently most research is in the field of cathodes for vacuum tubes. Research in thermionic converter technology is less intensive because of the difficulties of increasing thermionic emission of electrons from the flat surface, where field emission effect can not be applied. The practical importance of thermionic energy conversion is rapidly increasing due to increased needs for alternative energy sources. The most effective way of decreasing work function known today is the use of alkaline metal vapors, particularly cesium, and coating the emitter surface with oxide thin films. Use of Cs vapor is not without technical problems; and thin film coated cathodes generally show short lifetimes.

BACKGROUND

Quantum Mechanics and De Broglie Wave

It is well known from Quantum Mechanics that elementary particles have wave properties as well as corpuscular properties. The density of probability of finding an elementary particle at a given location is $|\psi|^2$ where $\psi$ is a complex wave function and has form of the de Broglie wave:

$$\psi=A\ \exp[(-i2\pi/h)(Et-pr)] \tag{1}$$

Here $\psi$ is wave function; h is Planck's constant; E is energy of particle; p is impulse of particle; r is a vector connecting initial and final locations; t is time.

There are well known fundamental relationships between the parameters of this probability wave and the energy and impulse of the particle:

$$E \text{ is electron energy and } p=(h/2\pi)k \tag{2}$$

Here k is the wave number of probability wave. The de Broglie wavelength is given by:

$$\lambda=2\pi/k \tag{3}$$

If time, t, is set to 0, the space distribution of the probability wave may be obtained. Substituting (2) into (1) gives:

$$\psi=A\ \exp(ikr) \tag{4}$$

FIG. 1 shows an elementary particle wave moving from left to right perpendicular to a surface 7 dividing two domains. The surface is associated with a potential barrier, which means the potential energy of the particle changes as it passes through it.

Incident wave 1 Aexp (ikx) moving towards the border will mainly reflect back as reflected wave 3 βA exp (−ikx), and only a small part leaks through the surface to give transmitted wave 5 α(x)A exp(ikx) ($\beta\approx1>>\alpha$). This is the well-known effect known as quantum mechanical tunneling. The elementary particle will pass the potential energy barrier with a low probability, depending on the potential energy barrier height.

BACKGROUND

Electron Interference

Usagawa in U.S. Pat. No. 5,233,205 discloses a novel semiconductor surface in which interaction between carriers such as electrons and holes in a mesoscopic region and the potential field in the mesoscopic region leads to such effects as quantum interference and resonance, with the result that output intensity may be changed. Shimizu in U.S. Pat. No. 5,521,735 discloses a novel wave combining and/or branching device and Aharanov-Bohm type quantum interference devices which have no curved waveguide, but utilize double quantum well structures.

Mori in U.S. Pat. No. 5,247,223 discloses a quantum interference semiconductor device having a cathode, an anode and a gate mounted in vacuum. Phase differences among the plurality of electron waves emitted from the cathode are controlled by the gate to give a quantum interference device operating as an AB type transistor.

Other quantum interference devices are also disclosed by Ugajin in U.S. Pat. No. 5,332,952 and Tong in U.S. Pat. No. 5,371,388.

BACKGROUND

Piezo-Electric Positioning

In their U.S. patent application Ser. No. 08/924,910 filed. Sep. 8, 1997, incorporate d herein by reference in its entirety, Edelson and Tavkhelidze describe vacuum diode devices in which the separation of the electrodes is effected using piezo-electric positioning elements. They also teach a method for fabricating electrodes in which imperfections on one are exactly mirrored in the other, which allows electrode to be positioned very closely together.

BRIEF DESCRIPTION OF THE INVENTION

Broadly the present invention is a method for enhancing the passage of elementary particles through a potential energy barrier utilizing interference of de Broglie waves to increase the probability of emission. This represents an improvement over all the aforementioned technologies.

In one embodiment, the invention provides an elementary particle-emitting surface having a series of indentations or protrusions. The depth of the indents (or height of the protrusions) is chosen so that the probability wave of the elementary particle reflected from the bottom of the indent interferes destructively with the probability wave of the elementary particle reflected from the surface. This results in a reduction of reflecting probability and as a consequence the probability of tunneling through the potential barrier to an adjacent surface is increased.

In another embodiment, the adjacent surface is absent. In this case, the energy spectrum of electrons becomes modified such that electrons may not tunnel out into the vacuum. This results in an increase in the Fermi level with a consequent reduction in apparent work function.

In a further embodiment, the probability wave extends beyond the barrier, allowing electrons to be pumped into vacuum with a suitably applied voltage to give enhanced field effect emission.

In further embodiments, the invention provides vacuum diode devices, including a vacuum diode heat pump, a thermionic converter and a photoelectric converter, in which either or both of the electrodes in these devices utilize said elementary particle-emitting surface.

In yet further embodiments, the invention provides devices in which the separation of the surfaces in such devices is controlled by piezo-electric positioning elements.

A further embodiment provides a method for making an elementary particle-emitting surface having a series of indentations or protrusions.

OBJECT AND ADVANTAGES

Objects of the present invention are, therefore, to provide new and improved methods and apparatus for particle emission, having one or more of the following capabilities, features, and/or characteristics:

An object of the present invention is to provide a method for promoting transfer of elementary particles across a potential barrier, comprising providing a surface on which the potential barrier appears having a geometrical shape for causing de Broglie interference between said elementary particles.

An advantage of the present invention is that destructive interference between the waves of emitted particles may be created, which allows for an increase in particle emission.

A further object of the present invention is to provide an elementary particle-emitting surface having a geometrical shape for causing de Broglie interference.

An advantage of the present invention is that thermionic emission is greatly enhanced and becomes an extremely practical technology.

An object of the present invention is to provide a surface having a series of indentations (or protrusions), the depth of which is chosen so that the probability wave of the elementary particle reflected from the bottom of the indent interferes destructively with the probability wave of the elementary particle reflected from the surface.

An advantage of the present invention is that the effective work function of the material comprising the surface is reduced.

REFERENCE NUMERALS IN THE DRAWINGS

11. Incident probability wave
13. Reflected probability wave
15. Transmitted probability wave
17. Surface
19. Indented or protruded surface
21. Reflected probability wave

DETAILED DESCRIPTION OF THE INVENTION

Figure 1:
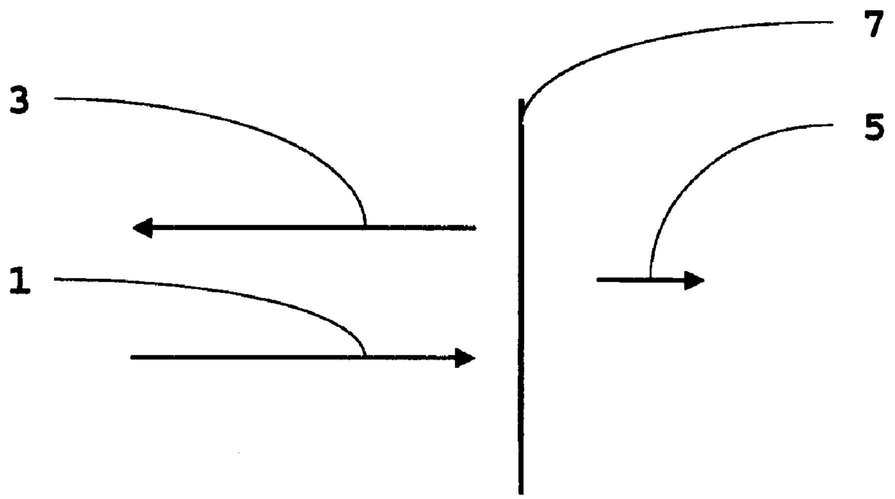
FIG. 1 shows in diagrammatic form, an incident probability wave, a reflected probability wave and a transmitted probability wave interacting with a substantially planar surface.
Figure 2:
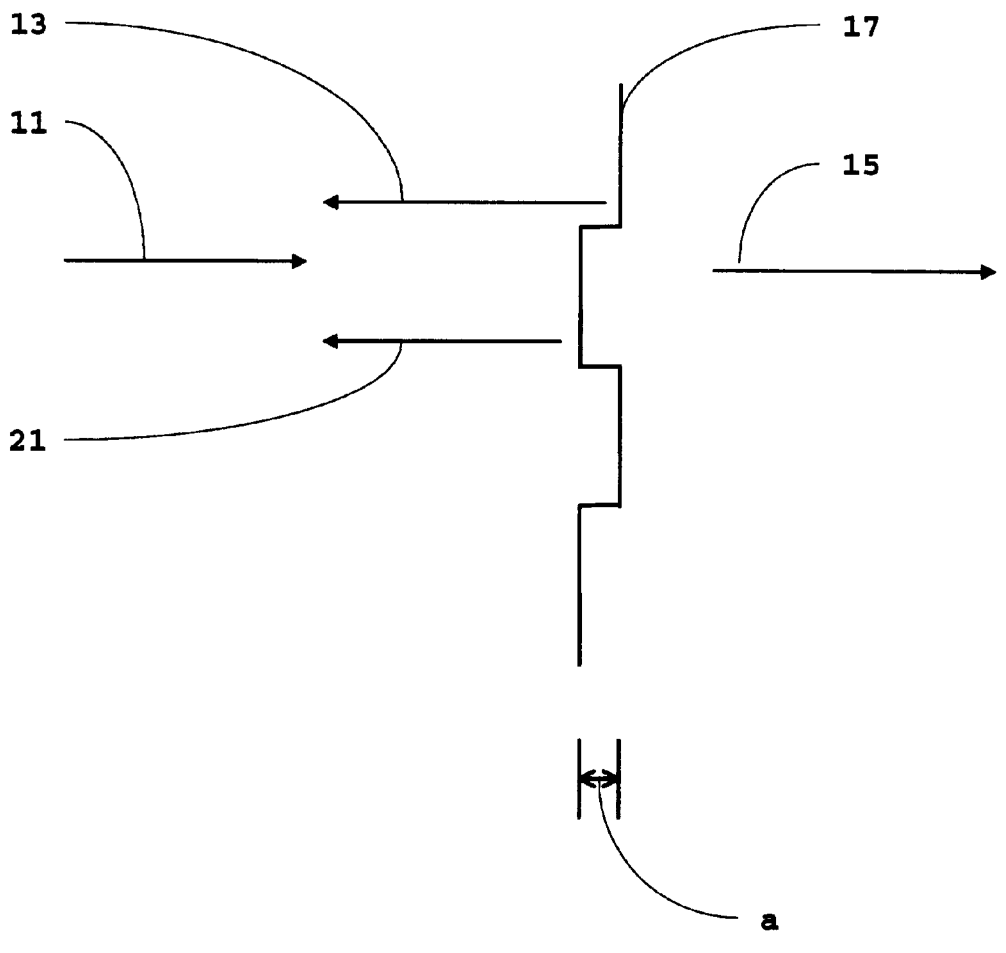
FIG. 2 shows in diagrammatic form, an incident probability wave, two reflected probability waves and a transmitted probability wave interacting with a surface having a series of indents (or protrusions).

Referring now to FIG. 2, two domains are separated by a surface 17 having an indented or protruded shape, with height a.

An incident probability wave 11 is reflected from surface 17 to give reflected probability wave 13, and from the bottom of the indent to give reflected probability wave 21. The reflected probability wave will thus be:

$$A\beta\,\exp(-ikx)+A\beta\,\exp[-ik(x+2a)]=A\beta\,\exp(-ikx)[1+\exp(-ik2a)] \quad (5)$$

When k2a=π, exp(−iπ)=−1 and equation (5) will equal zero.

Physically this means that for k2a=(2π/λ)2a=π+2πn and correspondingly λ=4a/(1+2n) where n=0, 1, 2. . . , the reflected probability wave equals zero. Further this means that the particle will not reflect back from the border. It also implies that the probability wave can leak through the barrier will occur with increased probability, and will open many new possibilities for different practical applications.

Without being bound by any particular theory, the enhanced leakage of electrons from a surface having the indented or protruded shape shown in FIG. 2 may be explained a number of different ways according to currently known theories of matter.

If the surface interference works to allow right-moving probability wave 15 to pass through the surface into the vacuum, without seeing the barrier, then it should work to allow a corresponding left moving wave (not shown in FIG. 2) to pass through the surface from the vacuum into the conductor, again without seeing the barrier.

If another conductor is arranged nearby, with a similar surface treatment, then this wavefunction would continue into the other conductor, thus becoming a tunneling path. The electron never makes it to the vacuum level, and thus does not violate conservation laws if it falls back to the other metal.

But in the absence of another conductor, it is less clear how the electron may behave. Several possibilities are excluded:

1. Electron cannot reflect back into the metal because wave mechanics forbids it.
2. Electron cannot move into the vacuum because this transition is forbidden (the electron would have negative kinetic energy)
3. Electron cannot stop on the surface. This will leads to accumulation of charge on the surface, which is contrary to the laws of electrostatics and thermodynamics.
4. Electron can not vanish.

This suggests that an electron with a wavelength corresponding to the step dimension a=λ/4 does not exist in metal. The same is true for harmonics of that wavelength. This means that gaps will appear in the energy spectrum below Fermi level (as in a semiconductor). This means that the Fermi level will increase because the number of electron (per volume) is not changed and they all should have separate levels (electrons are fermions). This will result in a lower work function.

Indents or protrusions on the surface should have dimensions comparable to de Broglie wavelength of electron. In particular indent or protrusion height should be $$a=\lambda(1+2n)/4 \quad (6)$$

Here n=0,1,2, etc

And the indent or protrusion width should be of order of 2λ.

If these requirements are satisfied then elementary particles will accumulate on the surface.

For semiconductor material, the velocities of electrons in the electron cloud is given by the Maxwell-Boltsman distribution:

$$F(v)dv=n(m/2\pi K_BT)\exp(-mv^2/2K_BT)dv \quad (7)$$

where F(v) is the probability of an electron having a velocity between v and v+dv.

The average velocity of the electrons is $$V_{av}=(3K_BT/m)^{1/2} \quad (8)$$

and the de Broglie wavelength corresponding to this velocity, calculated using formulas (2), (3) and the classical approximation p=mv is:

$$\lambda=h/(3m\,K_BT)^{1/2}=62A \text{ for } T=300\text{K}. \quad (9)$$

This gives a value for a of 76/4=19 Å. Indents or protrusions of these dimensions may be constructed on a surface by a number of means known to the art of micromachining. Alternatively, the indented or protruded shape may be introduced by depositing a series of islands on the surface.

For metals, free electrons are strongly coupled to each other and form a degenerate electron cloud. Pauli's exclusion principle teaches that two or more electrons may not occupy the same quantum mechanical state: their distribution is thus described by Fermi-Dirac rather than Maxwell-Boltsman. In metals, free electrons occupy all the energy levels from zero to the Fermi level ($\in_f$).

Figure 3:
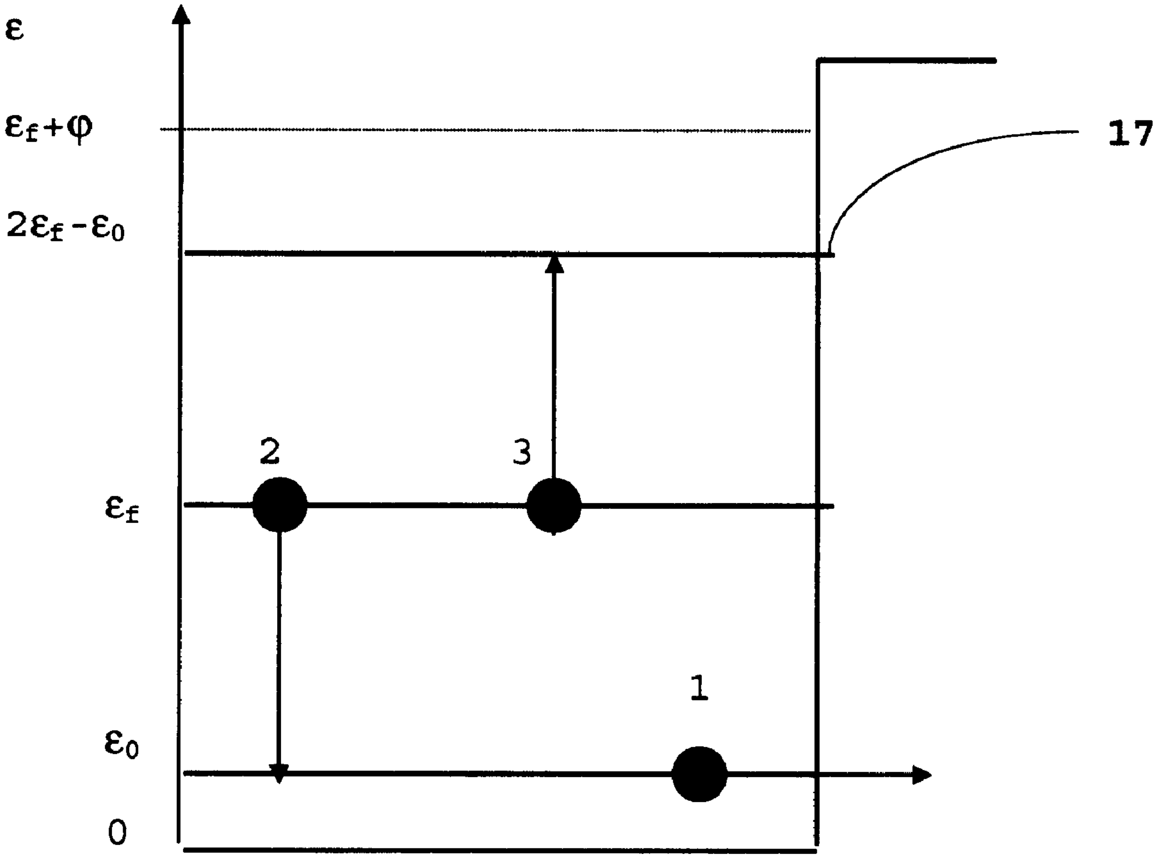
FIG. 3 shows in a diagrammatic form, the behavior of an electron in a metal.

Referring now to FIG. 3, electron 1 has energy below the fermi level, and the probability of occupation of these energy states is almost constant in the range of 0–$\epsilon_f$ and has a value of unity. Only in the interval of a few $K_BT$ around $\epsilon_f$ does this probability drop from 1 to 0. In other words, there are no free states below $\epsilon_f$. This quantum phenomenon leads to the formal division of free electrons into two groups: Group 1, which comprises electrons having energies below the Fermi level, and Group 2 comprising electrons with energies in the interval of few $K_BT$ around $\epsilon_f$.

For Group 1 electrons, all states having energies a little lower or higher are already occupied, which means that it is quantum mechanically forbidden for them to take part in current transport. For the same reason electrons from Group 1 cannot interact with the lattice directly because it requires energy transfer between electron and lattice, which is quantum mechanically forbidden.

Electrons from Group 2 have some empty energy states around them, and they can both transport current and exchange energy with the lattice. Thus only electrons around the Fermi level are taken into account in most cases when properties of metals are analyzed.

For electrons of group 1, two observations may be made. The first is that it is only these electrons which have wavelengths comparable to dimensions achievable by current fabrication techniques: 50–100 A corresponds to about 0.01$\epsilon_f$, ($E\sim k^2\sim(1/\lambda)^2$). Group 2 electrons of single valence metals on the other hand, where $\epsilon_f$=2–3 eV, have a de Broglie wavelength around 5–10 A which is difficult to fabricate using current techniques.

The second is that for quantum mechanical interference between de Broglie waves to take place, the main free path of the electron should be large. Electrons from group 1 satisfy this requirement because they effectively have an infinite main free path because of their very weak interaction with the lattice.

Referring again to FIG. 3 electron 1, which is a group 1 electron, has $k_0$=π/2a and energy $\epsilon_0$, and is moving to the indented or protruded surface 17. As discussed above, this particular electron will not reflect back from the surface due to interference of de Broglie waves, and will leave the metal, if a another metal nearby is present to which the electron can tunnel. Consider further that the metal is connected to a source of electrons, which provides electron 2, having energy close to $\epsilon_f$ (group 2). As required by the thermodynamic equilibrium electron 2 will lose energy to occupy state $\epsilon_0$, losing energy $\epsilon_f-\epsilon_0$, for example by emission of a photon with energy $\epsilon_p$ ($\epsilon_f-\epsilon_0$). If this is absorbed by electron 3, electron 3 will be excited to a state having energy $\epsilon_f+\epsilon_p=2\epsilon_f-\epsilon_0$.

Thus as a consequence of the loss of electron 1, electron 3 from the Fermi level is excited to a state having energy $2\epsilon_f-\epsilon_0$, and could be emitted from the surface by thermionic emission. The effective work function of electron 3 is reduced from the value of $\phi$ to $\phi-\epsilon_f+\epsilon_0=\phi-(\epsilon_f-\epsilon_0)$. In another words, the work function of electron 3 is reduced by $\epsilon_f\epsilon_0$.

If another metal is not adjacent to which the electron can tunnel, then an electron with this wavelength cannot exist (as discussed above) and will create a gap in the energy spectrum below the Fermi level. This will increase the Fermi level, leading to a reduction in work function.

Thus indents or protrusions on the surface of the metal not only allow electron 1 to be emitted into the vacuum with high probability by interference of the de Broglie wave, but also results in the enhanced probability of another electron (electron 3) by ordinary thermionic emission.

This approach will decrease the effective potential barrier between metal and vacuum (the work function).

This approach has many applications, including cathodes for vacuum tubes, thermionic converters, vacuum diode heat pumps, photoelectric converters, cold cathode sources, and many other in which electron emission from the surface is used.

In addition, an electron moving from vacuum into an anode electrode having an indented or protruded surface will also experience de Broglie interference, which will promote the movement of said electron into said electrode, thereby increasing the performance of the anode.

Figure 4:
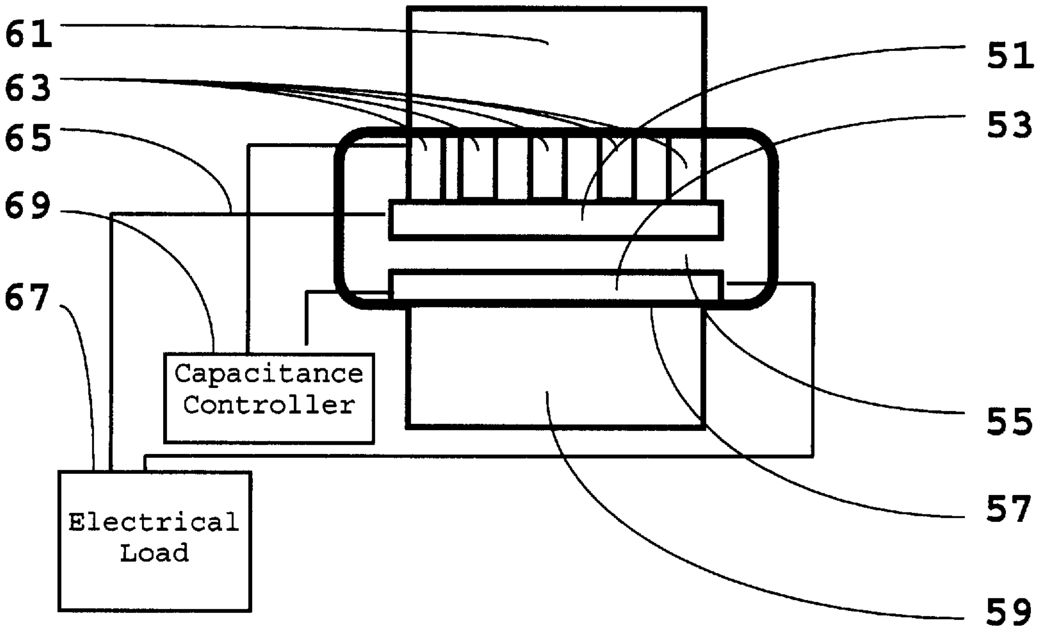
FIG. 4 is a diagrammatic representation of one embodiment of a thermionic converter with electrode separation controlled by piezo-electric actuators.

In a further embodiment, the separation of electrodes in a vacuum diode-based device may be controlled through the use of positioning elements, as shown in FIG. 4. The following description describes a number of preferred embodiments of the invention and should not be taken as limiting the invention.

Referring how to FIG. 4, which shows in a diagrammatic form a heat source 61, a heat sink 59, electrical connectors 65, and an electrical load 67 for a thermionic generator embodiment of the device shown. An electric field is applied to the piezo-electric actuator via electrical connectors which causes it to expand or contract longitudinally, thereby altering the distance 55 between electrodes 51 and 53. Electrodes 51 and 53 are connected to a capacitance controller 69 which controls the magnitude of the field applied by a power supply. Heat from heat source 61 is conducted through a housing 57 and piezo-electric actuators 63 to an emitter 51. The surface of emitter 51 has an indented or protruded surface as described above. Electrons emitted from emitter 51 move across an evacuated space 55 to a collector 53, where they release their kinetic energy as thermal energy which is conducted away from collector 53 through housing 57 to heat sink 59. The electrons return to emitter 51 by means of external circuit 65 thereby powering electrical load 67. The capacitance between emitter 51 and collector 53 is measured and capacitance controller 69 adjusts the field applied to piezo-electric actuators 63 to hold the capacitance, and consequently the distance between the electrodes, at a predetermined fixed value. This means that as the thermionic converter becomes hot and its components expand, the distance between the electrodes can be maintained at a fixed distance.

Figure 5:
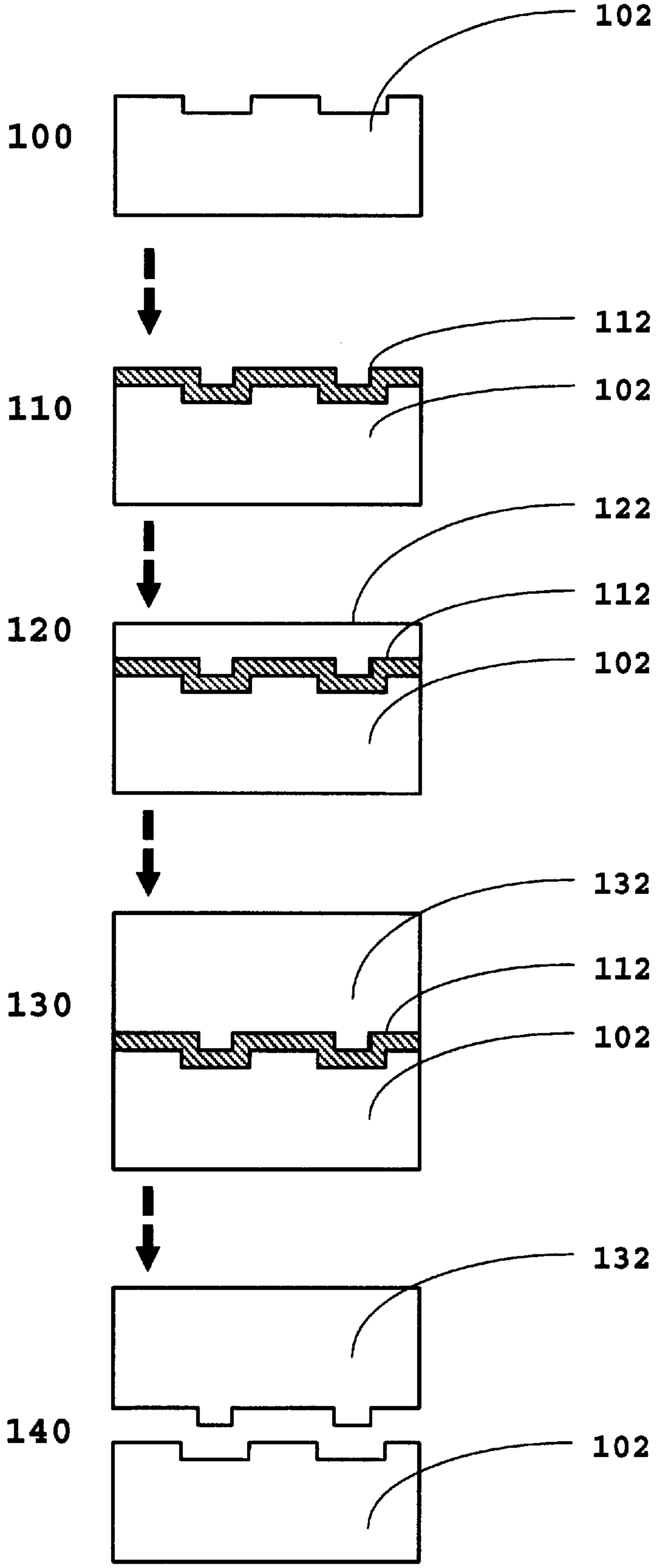
FIG. 5 is a schematic showing a process for the manufacture of pairs of electrodes.

For currently available materials, a device having electrodes of the order of 1×1 cm, surface irregularities are likely to be such that electrode spacing can be no closer than 0.1 to 1.0 μm. An approach to overcome this limitation which leads to enhanced performance in vacuum diode based devices is illustrated in FIG. 5, which describes in schematic form a method for producing pairs of electrodes having indented or protruded surfaces which replicate each other, in that protrusions in one are matched by indentations in the other and vice versa. The method involves a first step 100 in which an indented or protruded substrate 102 is provided. This forms one of the pair of electrodes. In a step 110 a thin layer of a second material 112, is deposited onto the surface of the substrate 102. This layer is sufficiently thin so that the shape of the substrate 102 is repeated with high accuracy. A thin layer of a third material 122 is deposited on layer. 112 in a step 120, and in a step 130 this is grown electrochemically to form a layer 132. This forms the second electrode. In one preferred embodiment, second material 112 has a melting temperature approximately 0.8 that of first material 102 and third material 122. In a step 140 the composite formed in steps 100 to 130 is heated up to a temperature greater than the melting temperature of layer 112 but which is lower than the melting temperature of layers 102 and 132. As layer 112 melts, layers 102 and 132 are drawn apart, and layer 112 is allowed to evaporate completely. In another preferred embodiment, layer 112 may be removed by introducing a solvent which dissolves it, or by introducing a reactive solution which causes the material to dissolve. This leaves two electrodes 102 and 132 whose surfaces mirror each other. This means that they may be positioned in very close proximity, as is required, for example, for the thermotunnel converter. In a variation of the method shown in FIG. 5, piezo-electric elements may be attached to one or both of the electrodes 102 and 132 and used to draw the two apart as the intervening layer 112 melts. This ensures that the two electrodes are then in the correct orientation to be moved back into close juxtaposition to each other by the piezo-electric elements.

SUMMARY RAMIFICATIONS AND SCOPE

The method for enhancing passage of elementary particles through a potential barrier has many applications in addition to those described above.

The method may be applied to thermionic converters, vacuum diode heat pumps and photoelectric converters, where a reduction in work function gives real benefits in terms of efficiency or operating characteristics.

The elementary particle emitting surface has many further applications. The surface is useful on emitter electrodes and other cathodes because it promotes the emission of electrons. It is also useful on collector electrodes and other anodes because it promotes the passage of electrons into the electrode. The surface also has utility in the field of cold cathodes generally, and electrodes incorporating such a surface can be used. Cold cathode structures are useful electron sources for applications such as flat panel displays, vacuum microelectronic devices, amplifiers, heat pumps, and electron microscopes. In addition, the approach has utility in field effect emission, and can be used for the manufacture of field emission electron emitter surfaces, which are particularly suitable for application to display devices.

I claim:

1. An elementary particle-emitting surface, wherein said elementary particle-emitting surface has an indented or protruded cross-section, wherein the depth of indents or height of protrusions in said indented or protruded cross-section is given by the relationship $\lambda(1+2n)/4$, where $\lambda$ is the de Broglie wavelength for said elementary particle, and where n is 0 or a positive integer selected such that the geometric shape of said elementary particle-emitting surface causes de Broglie interference between said elementary particles so that said tunneling is promoted.

2. The elementary particle-emitting surface of claim 1 in which said elementary particles are selected from the group consisting of electrons, protons, neutrons, and leptons.

3. A pair of elementary particle-emitting surfaces of claim 1, further wherein the geometric shape of the indented or protruded cross section of one member of the pair is replicated in the other member of the pair.

4. A thermionic vacuum diode device selected from the group consisting of: a thermionic converter, a thermo-tunneling converter, a vacuum diode heat pump, and a photoelectric generator, said thermionic vacuum diode device comprising the pair of elementary particle emitting surfaces of claim 3, wherein said elementary particle is an electron.

5. A method for making the pair of elementary particle emitting surfaces of claim 3, said method comprising the steps of:

a) providing a first substrate having an indented or protruded cross-section and fabricated from a first material having a melting temperature of $T_A$ degrees Kelvin;

b) coating a surface of said first substrate with a uniform layer of a second material wherein the uniform layer is approximately 5 to 100 Angstroms in thickness, said second material having a melting temperature of $T_B$ degrees Kelvin which is lower than the melting temperature of said first material;

c) coating said second material with a thick layer of a third material having a melting temperature of $T_C$ degrees Kelvin which is greater than the melting temperature of said second material, thereby forming a composite comprising said first, said second, and said third materials;

d) effecting a separation in said composite so that said first and third materials no longer form a single composite;

e) removing said second material.

6. The method of claim 5 in which said second material is removed by a process selected from the group consisting of: heating to a temperature greater than $T_B$ but less than either $T_A$ or $T_C$ and allowing said second material to evaporate completely, introducing a solvent to dissolve said second material, and introducing a reactive solution which reacts with said second material and dissolves it.

7. The method of claim 5 additionally comprising the steps of:

a) attaching said first substrate and said third material to controllable positioning device, said controllable positioning device held by a rigid housing;

b) separating said first substrate from said third material in step d) of claim 5 using said controllable positioning device, so that imperfections on the surface of said first substrate are maintained in precise spatial orientation with said replicated imperfections on said second substrate.

8. The method of claim 5 wherein said controllable positioning device is a piezo-electric device.

* * * * *